Figure 1:
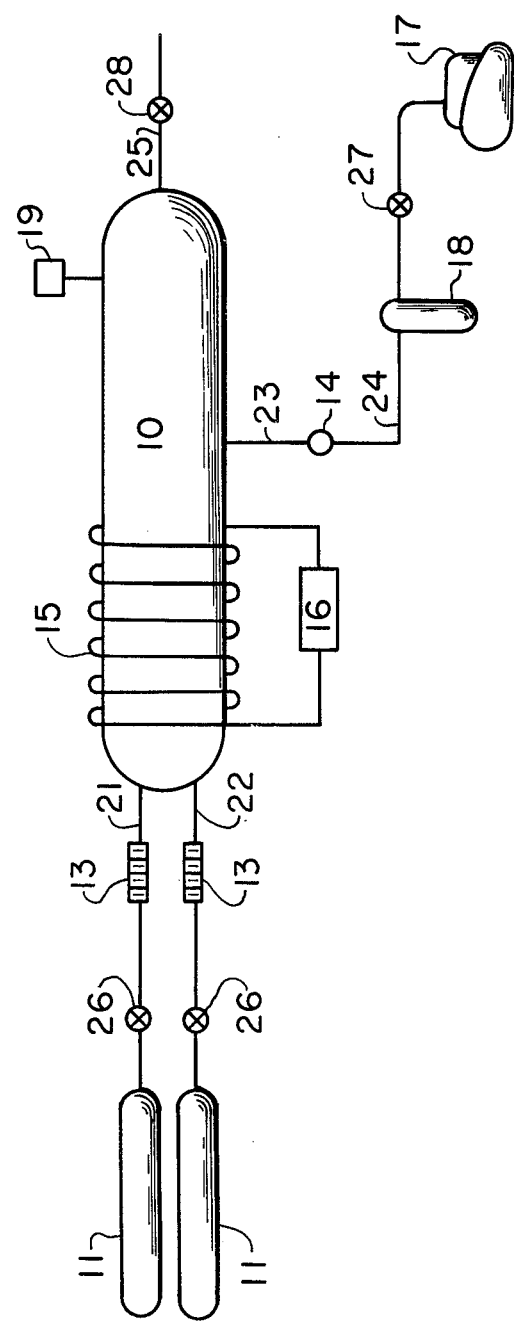

United States Patent [19]

Kny et al.

[11] 4,329,418

[45] May 11, 1982

[54] ORGANOMETALLIC SEMICONDUCTOR DEVICES

[75] Inventors: Erich Kny, Vienna, Austria; William J. James; Leonard L. Levenson, both of Rolla, Mo.; Robert A. Auerbach, Pittsburgh, Pa.

[73] Assignee: Lord Corporation, Erie, Pa.

[21] Appl. No.: 206,764

[22] Filed: Nov. 14, 1980

[51] Int. Cl.³ .............................................. B05D 3/06
[52] U.S. Cl. ............................. 430/270; 204/164; 204/165; 427/39; 427/43.1; 430/296; 430/311
[58] Field of Search ................... 427/38, 39, 40, 43.1; 204/164, 165; 430/270, 296, 311

[56] References Cited

U.S. PATENT DOCUMENTS

| | | | |
|---|---|---|---|
| 3,243,363 | 3/1966 | Helwig | 427/39 |
| 3,991,228 | 11/1976 | Carlson et al. | 427/39 |
| 4,060,660 | 11/1977 | Carlson et al. | 427/39 |
| 4,140,814 | 2/1979 | Hynecek | 427/39 |
| 4,261,650 | 4/1981 | Sprokel | 427/38 |

*Primary Examiner*—John H. Newsome
*Attorney, Agent, or Firm*—John A. Gazewood

[57] ABSTRACT

Organotin semiconductor thin films are deposited on a substrate by plasma deposition of reactive organotin species. Conductivity can be increased by heat-treating organotin semiconductors in a reducing atmosphere at a temperature below the melting point of tin. Organotin semiconductors are rendered conductive by exposure to electron or particle beam.

8 Claims, 2 Drawing Figures

Changes in conductivity of organotin-glow discharge films due to heat treatment in reducing atmosphere (8.5% $H_2$/91.5% He at 200 mTorr)

$\sigma$ = conductivity         R = resistance of particular specimens

ORGANOMETALLIC SEMICONDUCTOR DEVICES

FIELD OF THE INVENTION

This invention relates to metallic-like organometal films having semiconducting properties. More particularly, the invention is concerned with: (1), special organotin films which exhibit semiconducting properties; (2), the processes for preparing such films; (3), the means for altering the properties of such films; (4), the articles of manufacture comprising such films; and, (5), the processes for making such articles.

BACKGROUND OF THE INVENTION

In the manufacture of semiconducting devices, the most commonly used materials are crystals of germanium and silicon in the form of single crystals. These crystals may or may not be modified by the use of dopants which control the conductivity of the germanium or silicon crystal. Thin film semiconductors are also known, such as semicrystalline and amorphous silicon films and molybdenum trioxide films. Dopant materials are often introduced into the semiconductor crystal by forming a plasma of dopant vapor. The dopant ions, which are selectively extracted from the plasma, are accelerated to provide sufficient energy for their implantation. Thin films associated with integrated circuit technology are typically deposited by pyrolysis reactions, hydrolysis, R-F sputtering, evaporation, anodization, chemical vapor deposition, electrodeposition and sintering processes.

Tin, also, has a known semiconducting modification: α-tin or gray tin. This modification can be commonly obtained in the form of a fine powder. Although rods, foils or wires may be obtained by compressing the gray tin powder into such forms, and single crystal gray tin can be drawn, thin film semiconductors of gray tin are not known.

Typically, glow discharge plasma processes, in which various gases and vapors can be transformed into solid films, yield transparent insulating and conducting films. For example, Hynecek U.S.A. Pat. No. 4,140,814, issued Feb. 20, 1979, describes a process whereby a transparent conductive layer of $SnO_2$ is deposited on a dielectric substrate by an RF plasma-assisted chemical vapor reaction of carbon dioxide with an organotin compound such as tetramethyl tin. Thin film formation from a plasma can be effected in a glow discharge reactor which can be inductively or capacitatively coupled to an exciting radio frequency power source. Operating parameters, such as reactor geometry, the arrangement of the radio frequency coil or of the electrodes, the composition of the feed materials, flow rate of gaseous matter, system pressure and input power, are effective to influence the composition, uniformity and depositional characteristics of such plasma-deposited thin films. Typically, films obtained by plasma deposition employing organic feed materials are organic solids and insulators; although there are a limited number of known organic semiconductive materials, see Sansman et al. U.S. Pat. No. 4,080,332, issued Mar. 21, 1978 and Griffith et al. U.S. Pat. No. 4,102,873, issued July 25, 1978. It is possible to obtain conductive films by employing organometal and inorganic feed materials and, in some cases, especially at high power inputs, electrically conducting amorphous carbon films can be obtained. Conversely, thin semiconducting films by plasma deposition of organometal feed materials are not known.

In accordance with the present invention, there are provided semiconducting organotin thin films, as well as processes for preparing such films by plasma deposition of organotin feed materials. The invention provides processes for modifying the conductivity of such semiconductor films and, in another aspect, provides devices having conductive elements disposed in a semiconductive matrix and processes for producing such devices.

Briefly, the present invention is based on the discovery that certain organotin compounds in vapor form can be employed as feedstock in a glow discharge plasma deposition process to provide thin films having a metallic appearance. The composition of such films is characterized by a carbon content less than and a tin content higher than the carbon and tin contents, respectively, of the original organotin feed material. The films have an unexpected semiconducting property with a conductivity in the range of $10-1\times10^{-2}$ $OHM^{-1}$ $CM^{-1}$. The semiconducting organotin films produced in accordance with the invention characteristically have an amorphous structure. It has also been found that heat treatment of the thin films of this invention at temperatures not exceeding the melting point of tin ($T_f = 505°$ K. $= 232°$ C.) can effect an increase in conductivity of the films without loss of the semiconducting function. It has also been found that high energy irradiation, such as by electron or particle beams, of organotin semiconductor thin films of the invention results in the conversion of the irradiated area to a conductor, whereby there can be produced devices having conductive elements disposed in a semiconducting matrix.

Figure 2:
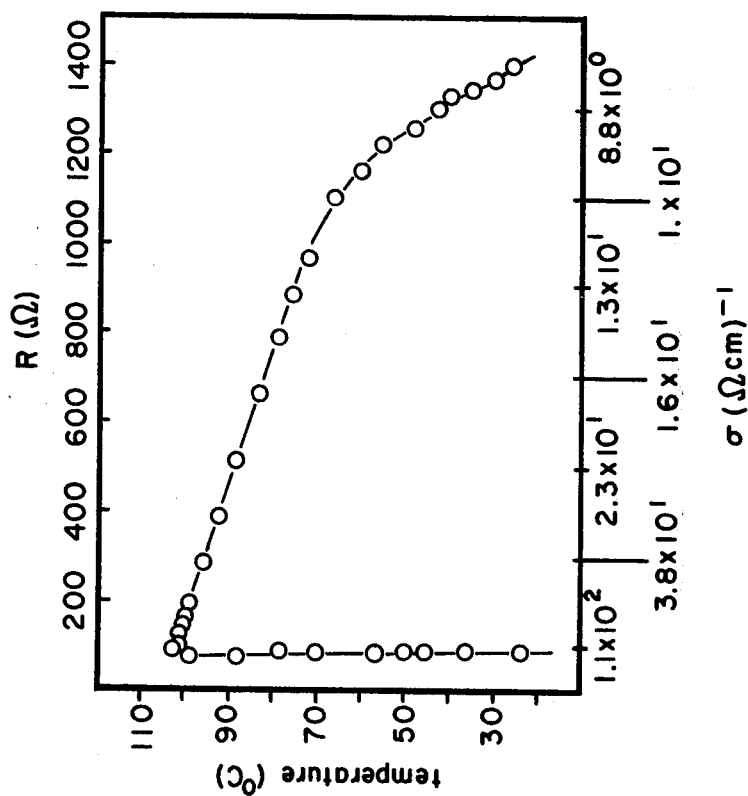

FIG. 1 is a schematic representation of an apparatus which can be employed in the practice of the invention, and, FIG. 2 is a graphical representation of the change in conductivity of thin film semiconductor produced according to this invention when heated to a temperature below the melting point of tin.

More particularly, in accordance with a first aspect of this invention there are provided semiconducting thin films consisting essentially of carbon, hydrogen and tin; said films being characterized by a conductivity ranging from 10 to $1\times10^2$ $ohm^{-1}$ $cm^{-1}$ and having a carbon tin atomic ratio of 2:1 or less.

In a second aspect of the invention, there is provided a method for preparing semiconductor devices comprising exposing at least one substrate to a glow discharge plasma consisting essentially of fragments of at least one organotin compound for a time sufficient to deposit a thin, solid, continuous semiconductive film on said at least one substrate.

In yet another aspect, the invention provides a method for modifying the conductivity of a semiconductor device comprising exposing at least one substrate to a glow discharge plasma consisting essentially of fragments of at least one organotin compound for a time sufficient to deposit a thin, solid, continuous semiconductive film on said at least one substrate and heat treating the resulting semiconductor device at a temperature below the melting point of tin.

The invention includes also a method for providing a film having conductive properties comprising exposing at least one substrate to a glow discharge plasma consisting essentially of fragments of at least one organotin compound for a time sufficient to deposit a thin, solid, continuous semiconductive film on said at least one substrate and irradiating said semiconductive film with high energy ionizing beam.

The invention further provides structures having at least one conductive element disposed within a semiconducting matrix and a method for producing such structures comprising exposing a substrate to a glow discharge plasma consisting essentially of fragments of at least one organotin compound for a time sufficient to deposit a thin, solid, continuous semiconductive film on said at least one substrate. By tracing a focused high energy beam over at least a portion of said semiconductive film, conductive tin is formed in the irradiated portion of said film.

Referring now more particularly to FIG. 1, there is illustrated a typical plasma deposition reactor 10, provided with non-reactive gas reservoir 11 and reactive monomer reservoir 12, with conduit means 21 and 22 to deliver non-reactive gas or reactive monomer, respectively, to reactor 10. Flowmeter 13 are provided in conduit means 21 and 22 for measuring flow rates into reactor 10 and vacuum gauge 14 is provided in conduit means 23 to monitor the pressure within the reactor system. Valves 26 are provided in conduit means 21 and 22 to regulate the flow of non-reactive gas and reactive monomer to reactor 10. A suitable helical coil is connected to a suitable energy source 16, such as a radio frequency oscillator. The reaction system is also fitted with vacuum source 17, and trap 18 with their conduit means 24 and valve means 27; temperature monitoring means 19; and vent conduit means 25 with its valve means 28. The reactor system also includes an appropriate rack, not shown, for receiving substrates upon which the organotin films of the invention are deposited.

In practicing this invention, one or more selected substrates are placed on the rack and disposed within the plasma deposition reactor. Preferably, the substrates will be located entirely within the visible plasma region; however, some or all of the substrates can be located partially within or entirely outside the visible plasma region. Substrates which can be employed in the practice of the invention can include substantially any porous or non-porous, flexible or rigid, inorganic or organic material, and can include dielectric and conductive materials. Representative substrate materials include metals, ceramics, glass and plastics.

Although the step may be dispensed with, the substrates are first exposed to a plasma of an essentially non-reactive gas, such as argon, helium, xenon or nitrogen at a pressure of 50 to 200 mTorr, preferably 50 to 150 mTorr. Plasma can be produced by any available conventional means, including radio frequency discharge, microwave discharge, or electrodes. Suitable plasmas can be formed with a radio frequency discharge operated between 3 megahertz and 100 megahertz and about 1 to 200 watts or with a microwave discharge operated between 500 to 4000 meganertz and 5 to 400 watts. The non-reactive gas plasma is not only effective in improving adhesion of the organotin semiconductor films but also aids in removing contaminants from the deposition zone and the substrates which might adversely affect film quality. The substrates are exposed to the non-reactive gas plasma for a time period in the range from 100 seconds to 4000 seconds.

Solid semiconducting organotin films are obtained by exposing the substrate, whether or not previously exposed to the non-reactive gas plasma previously discussed, supra, to a plasma of certain organotin monomers. Organotin monomers which are effective to provide thin film semiconductor devices in accordance with this invention have the characteristic formula

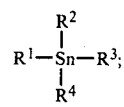

wherein $R^1$, $R^2$, $R^3$, and $R^4$ can be the same or different, and each is an alkyl group having from 1 to 8 carbon atoms. Suitable organotin monomers must be a gas or liquid at ambient conditions and, if liquid, should have a vapor pressure above the liquid which is at least in the millitorr range. In cases where such a vapor pressure is normally not available, the liquid can be heated to increase its vapor pressure. Exemplary organotin compounds include tetramethyltin, tetraethyltin, tetrapropyltin and their analogs with mixed hydrocarbon chains, such as trimethylmonoethyltin and dimethyldiethyltin. The vapor of the organotin monomer is introduced into the plasma deposition reactor at a flow rate sufficient to provide a pressure in the range from 10 to 200 mTorr, preferably 10 to 100 mTorr. The substrates are exposed to the reactive organotin plasma for from 50 seconds to 6000 seconds. The exposure of the substrates to the non-reactive gas plasma is generally effected at a greater pressure than is their exposure to the reactive organotin monomer plasma. It is preferred that the non-reactive gas plasma be extinguished and the reaction zone purged with reactive organotin monomer vapor before the substrates are exposed to the reactive organotin monomer plasma. Alternatively, reactive organotin monomer vapor can be introduced into the plasma deposition reactor without extinguishing the non-reactive gas plasma while simultaneously incrementally ceasing the introduction of non-reactive gas and reducing the pressure to the desired range. It is currently preferred that the deposition of the organotin semiconductor devices not be effected from a plasma of non-reactive gas and reactive organotin monomer. The thin film organotin semiconductor devices produced in accordance with this invention have a film thickness in the range from 500 to 10000 nanometers.

The conductivity of organotin semiconductor devices produced in accordance with this invention can be modified by a heat treatment at temperatures below the melting point of tin ($T_f = 505°$ K.). The heat treatment is preferably effected at a reduced pressure in the range from 50 mTorr to 5 Torr, preferably from 100 to 500 mTorr in a reducing atmosphere. Preferably, the reducing atmosphere is a hydrogen bearing gas, including pure hydrogen, forming gas (5 percent hydrogen in nitrogen) and mixtures of hydrogen with other inert gases, such as helium. Treatment temperatures below 50° C. result in a reduction in conductivity values, whereas treatment temperatures above 50° C. result in an increase in conductivity. Organotin semiconductors are heat-treated in accordance with this invention at a reduced pressure in a reducing atmosphere by incrementally increasing the temperature to a level which provides the desired conductivity value or a steady state condition is reached, above which temperature no further increase in conductivity is obtained. The heat-treated organotin semiconductors are characterized by having a lower carbon and hydrogen content than originally present.

Organotin semiconductors can be converted to conductors in accordance with this invention by exposing all or selected portions of the semiconductor to electron or particle beams having an energy in the range from 5 to 500 Kev, whereby that portion of the semiconductor which is exposed to the high energy beam is converted to conducting tin. By using an appropriate masking pattern, the unmasked portions are converted to conducting tin, thus producing conducting structures in a semiconducting matrix.

The following examples are illustrative of the present invention. It should be understood that such examples are not to be construed as to unduly limit the invention.

EXAMPLE I

Formation of Semiconducting Thin Organotin Films Employing an Inductively Coupled Radio Frequency Glow Discharge Plasma Deposition Reactor System as Shown in FIG. 1

Glass substrates are distributed evenly thoughout reactor 10. The glass substrates are exposed to an argon ion plasma at 30 W, 3.0 MHz for 2500 seconds at a system pressure of 100 mTorr. The argon ion plasma is extinguished and the reactor is flushed with tetramethyltin vapor. The argon ion plasma-treated substrates are exposed to tetramethyltin plasma at 30 W, 3.9 MHz for 4400 seconds at a system pressure maintained in the range of 35–40 mTorr. The substrates are coated with a metallic-like deposit having a thickness of 30 nanometers. The film is a semiconductor having a $3.2 \times 10^{-1} - 1.3 \times 10^{-2}$ OHM$^{-1}$ CM$^{-1}$ conductivity. The C:Sn atomic ratio of the films is between 1.39 and 1.60. X-ray diffraction and electron beam diffraction show the organotin semiconducting films to be amorphous.

EXAMPLE II

Heat Treatment of Semiconducting Thin Organotin Films in a Reducing Atmosphere as a Mean to Increase Conductivity Semiconducting organotin films on glass substrates of Example I are placed in a vacuum system. A hydrogen-helium gas mixture (8.5% hydrogen) is introduced at a system pressure which is maintained in the range of 180–200 mTorr. The change in conductivity is monitored with a four-point probe in situ. Heating up to 40° C. shows a reversible characteristic for the conductivity. Above 40° C., an irreversible reaction occurs, thereby increasing the conductivity to values of $1.10^2$ OHM$^{-1}$ CM$^{-1}$. A steady state is reached after 4000 seconds at 102.5° C. The resulting films are still semiconductors as shown by the negative temperature slope coefficient in FIG. 2. The heat-treated films are stable and show reversible behavior due to heating up to temperatures of 102.5° C. XPS and SIMS evaluation show the heat-treated films have a lower carbon and hydrogen content than is present in the original non-heat treated films.

EXAMPLE III

Conversion of Organotin Semiconductor to Conductive Tin

Organotin semiconductor films on glass substrates of Example I are exposed to a focused electron beam having an energy of 100 Kev. Those areas of the semiconductor films which are traced by the focused electron beam are converted to conductive tin crystals.

What is claimed is:

1. A semiconductive element consisting essentially of a thin, continuous, solid film consisting essentially of carbon, hydrogen and tin.

2. A semiconductive element according to claim 1 wherein said film has a carbon:tin atomic ratio of 2:1 or less.

3. A method for forming a semiconductor device comprising exposing at least one substrate to a glow discharge plasma comprising ionized fragments of at least one organotin monomer for a time sufficient to deposit on said at least one substrate a thin, continuous, solid semiconductive film having a composition consisting essentially of carbon, hydrogen and tin.

4. A method according to claim 3 comprising
   (a) Disposing within a reaction zone at least one substrate;
   (b) Introducing into such reaction zone a vaporized material consisting essentially of fragmentable organotin monomer;
   (c) Subjecting such vaporized fragmentable organotin monomer to an electrical glow discharge, whereby there is formed a plasma comprising reactive fragments of said organotin monomer;
   (d) Contacting said at least one substrate within said reaction zone with said reactive fragments; and
   (e) Depositing on said substrate a thin, solid, continuous amorphous semiconductive film consisting essentially of carbon, hydrogen and tin.

5. A method for increasing conductivity of a thin film semiconductor device comprising exposing at least one substrate to a glow discharge plasma comprising ionized reactive fragments of at least one organotin monomer for a time sufficient to deposit on said at least one substrate a thin, solid, continuous semiconductive film having a composition consisting essentially of carbon, hydrogen and tin; and heating said semiconductive film at a temperature below 232° C., whereby the conductivity of said film is increased.

6. A method for preparing a thin film conductor comprising, (1), exposing at least one substrate to a glow discharge plasma comprising ionized reactive fragments of at least one organotin monomer for a time sufficient to deposit on at least one substrate a thin, solid, continuous semiconductive film having a composition consisting essentially of carbon, hydrogen and tin; and, (2), contacting said semiconductive film with ionizing radiation to convert the tin moiety of said semiconductive film to conductive tin.

7. A method for forming a device having at least one conductive element disposed within a semiconductor matrix comprising, (1), exposing at least one substrate to a glow discharge plasma comprising ionized reactive fragments of at least one organotin monomer to deposit on at least one substrate a thin, solid, continuous, semiconductive film; and, (2) exposing a selected portion of said semiconductive to focused ionizing radiation to convert tin moieties of said selected portion to conductive tin.

8. A device comprising conductive tin element disposed within an organotin semiconductor matrix.

* * * * *